(12) United States Patent
Lin

(10) Patent No.: US 11,698,404 B2
(45) Date of Patent: Jul. 11, 2023

(54) UNIVERSAL SWITCHING PLATFORM AND METHOD FOR TESTING DYNAMIC CHARACTERISTICS OF A DEVICE

(71) Applicant: Device Dynamics Lab Co., Ltd., Zhubei (TW)

(72) Inventor: Ming-Cheng Lin, Zhubei (TW)

(73) Assignee: Device Dynamics Lab Co., Ltd., Zhubei (TW)

( * ) Notice: Subject to any disclaimer, the term of this patent is extended or adjusted under 35 U.S.C. 154(b) by 111 days.

(21) Appl. No.: 17/497,666

(22) Filed: Oct. 8, 2021

(65) Prior Publication Data

US 2022/0221503 A1 Jul. 14, 2022

(30) Foreign Application Priority Data

Jan. 12, 2021 (TW) .................................. 110101137

(51) Int. Cl.
*G01R 31/26* (2020.01)
*H03K 17/687* (2006.01)

(52) U.S. Cl.
CPC ..... *G01R 31/2607* (2013.01); *H03K 17/6871* (2013.01)

(58) Field of Classification Search
None
See application file for complete search history.

(56) References Cited

U.S. PATENT DOCUMENTS

2014/0361790 A1* 12/2014 Nakanishi ........ G01R 31/31924
324/555

* cited by examiner

*Primary Examiner* — Son T Le
*Assistant Examiner* — Brian Butler Geiss
(74) *Attorney, Agent, or Firm* — Merchant & Gould P.C.

(57) ABSTRACT

A universal switching platform is configured to test a device under test, and includes a first power source, a first switch, a second switch and a second power source. The first switch, the second switch and the second power source are coupled in series between positive and negative terminals of the first power source. The common node of the first and second switches and the negative terminal of the first power source are configured to be respectively coupled to first and second terminals of the device under test. The universal switching platform provides a voltage and a current to test the device under test when the first and second switches are controlled to transition between conduction and non-conduction.

11 Claims, 11 Drawing Sheets

UNIVERSAL SWITCHING PLATFORM AND METHOD FOR TESTING DYNAMIC CHARACTERISTICS OF A DEVICE

CROSS-REFERENCE TO RELATED APPLICATION

This application claims priority of Taiwanese Patent Application No. 110101137, filed on Jan. 12, 2021.

FIELD

The disclosure relates to device testing techniques, and more particularly to a universal switching platform and a universal switching method for testing dynamic characteristics of a device.

BACKGROUND

Third generation semiconductor devices are based on wide bandgap compound materials, such as silicon carbide (SiC) and gallium nitride (GaN). Because of their superior material property, high carrier mobility and high bandgap (e.g., a figure of merit (FOM) of GaN devices being 5 to 10 times higher than that of silicon (Si) devices), they have great potential in replacing their Si counterparts in high voltage, high power and high frequency applications.

Although GaN devices have passed Si-based reliability tests defined in JEDEC standard, it still takes time to build confidence in system field tests and prove robustness of GaN devices in application. At present, because third generation semiconductor devices behave differently in static and dynamic conditions, most existing system level reliability tests for GaN devices focus on hard switching operation. However, none of these tests can predict lifetimes of GaN devices in various applications.

TABLE 1

| hard switching test vehicle | | Panasonic (FIG. 1) | TI Transphorm (FIG. 2) | (FIG. 3) |
|---|---|---|---|---|
| setup | | LR load | L load | boost converter |
| power consumption | | high (>100 W) | medium (>10 W) | high (400 W) |
| DUT number (sample size) | | limited | V | limited |
| acceleration | temperature | V | V | V |
| flexibility | voltage | V | V | V |
| | current | V | V | V |
| | frequency | limited | limited | limited |
| | duty cycle | limited | limited | limited |

Referring to FIGS. 1 to 3 and Table 1 above, FIGS. 1 to 3 respectively illustrate hard switching test vehicles of Panasonic, Texas Instrument (TI) and Transphorm, and Table 1 lists comparisons among these hard switching test vehicles. Each of these hard switching test vehicles is configured to test a device under test (DUT) 19 (also referred to as a sample). Panasonic uses an inductor-resistor (LR) load to reduce duty cycle and limit frequency, so that power consumption can be reduced to 100 W. However, a duty cycle as low as 3% makes it impossible to represent real system operation. TI uses an inductor (L) load to reduce duty cycle and frequency, so as to obtain low power consumption. However, this leads to a low duty cycle and a limited frequency. Transphorm uses a boost converter as a load. However, this results in power consumption as high as 400 W. Therefore, a total number of the samples that can be tested simultaneously and respectively by multiple hard switching test vehicles of Transphorm is limited.

SUMMARY

Therefore, an object of the disclosure is to provide a universal switching platform and a universal switching method that can alleviate at least one drawback of the prior art.

According to an aspect of the disclosure, the universal switching platform is configured to test a device under test. The device under test has a first terminal and a second terminal. The universal switching platform includes a first power source, a first switch, a second switch and a second power source. The first power source has a positive terminal, and a negative terminal that is configured to be coupled to the second terminal of the device under test. The first switch, the second switch and the second power source are coupled in series between the positive and negative terminals of the first power source, with the first switch coupled to the positive terminal of the first power source and the second power source coupled to the negative terminal of the first power source. A common node of the first and second switches is configured to be coupled to the first terminal of the device under test. The universal switching platform provides a voltage and a current to test the device under test when the first and second switches are controlled to transition between conduction and non-conduction.

According to another aspect of the disclosure, the universal switching method is for controlling the aforesaid universal switching platform and the device under test coupled thereto. The universal switching method includes a step of controlling the first switch, the second switch and the device under test to transition between conduction and non-conduction, where an operating state of the second switch is substantially different from an operating state of the first switch, and an operating state of the device under test is substantially identical to the operating state of the second switch.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that throughout the disclosure, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout the disclosure should be interpreted as being such when looking at those elements alone.

Figure 1:
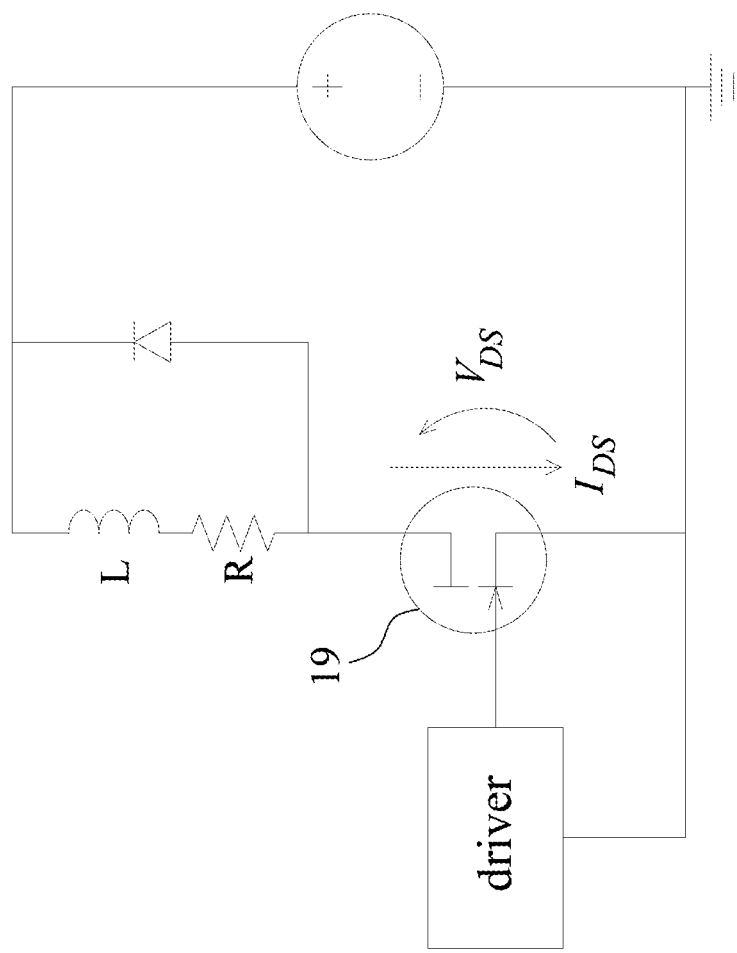
FIGS. 1 to 3 are circuit block diagrams illustrating hard switching test vehicles of Panasonic, Texas Instrument and Transphorm, respectively.
Figure 2:
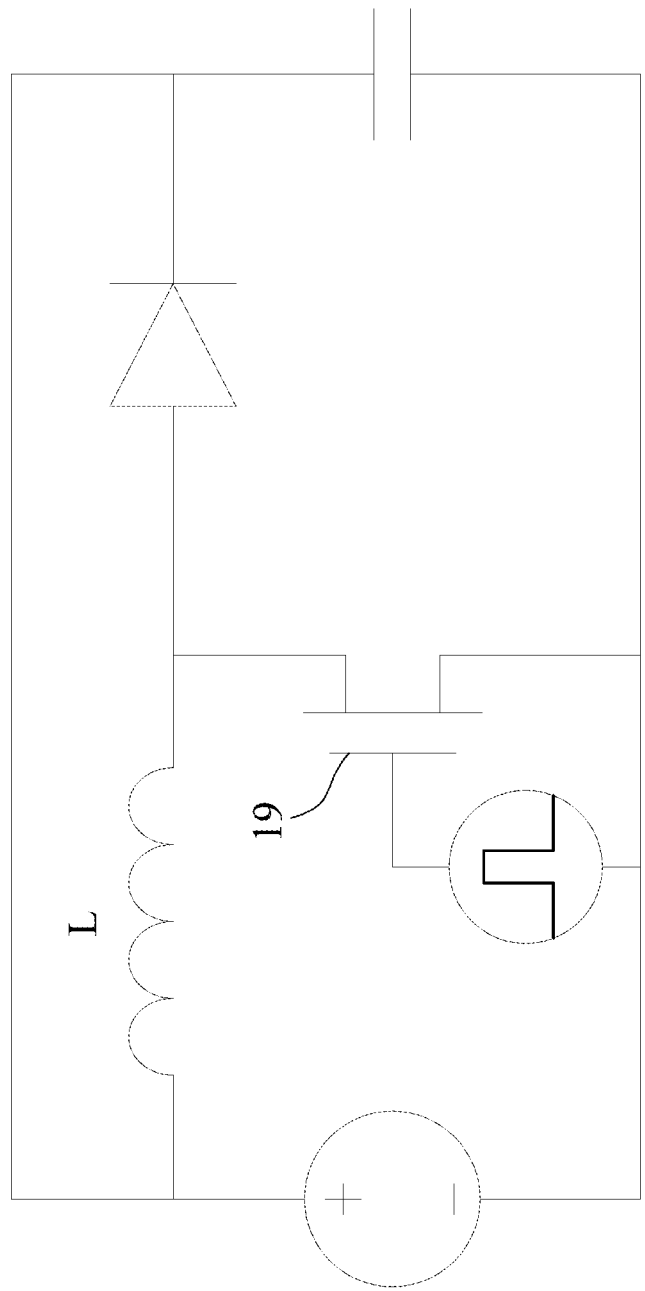
Figure 3:
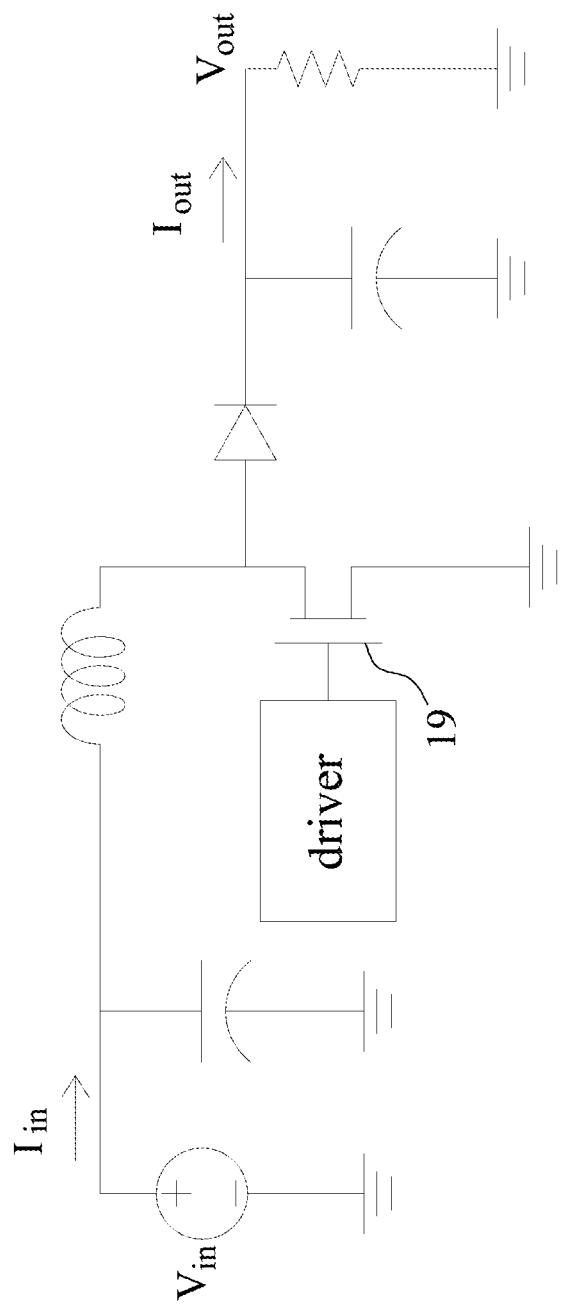
Figure 4:
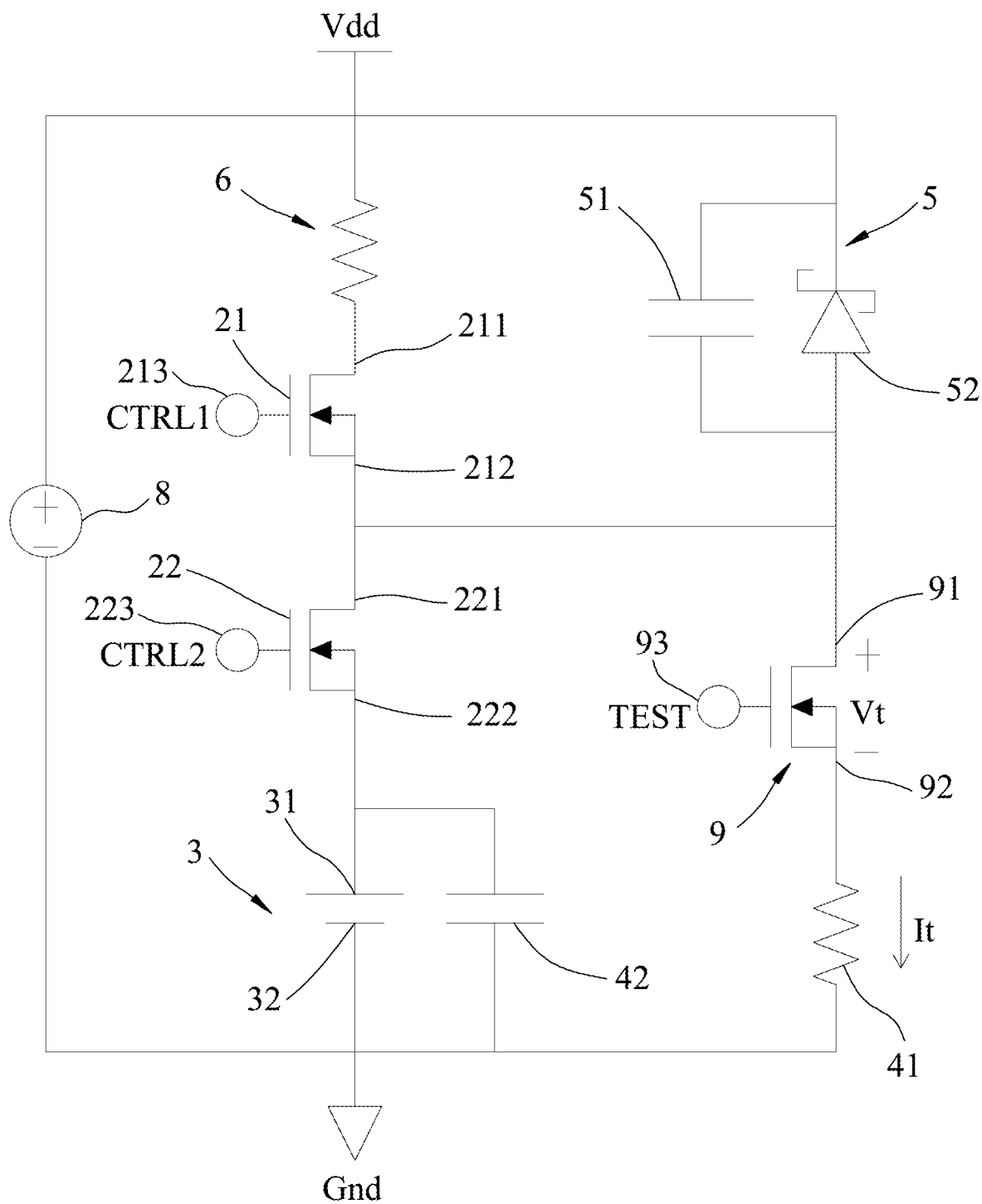
FIG. 4 is a circuit diagram illustrating an embodiment of a universal switching platform according to the disclosure configured to test a transistor that is forward conducting.
Figure 5:
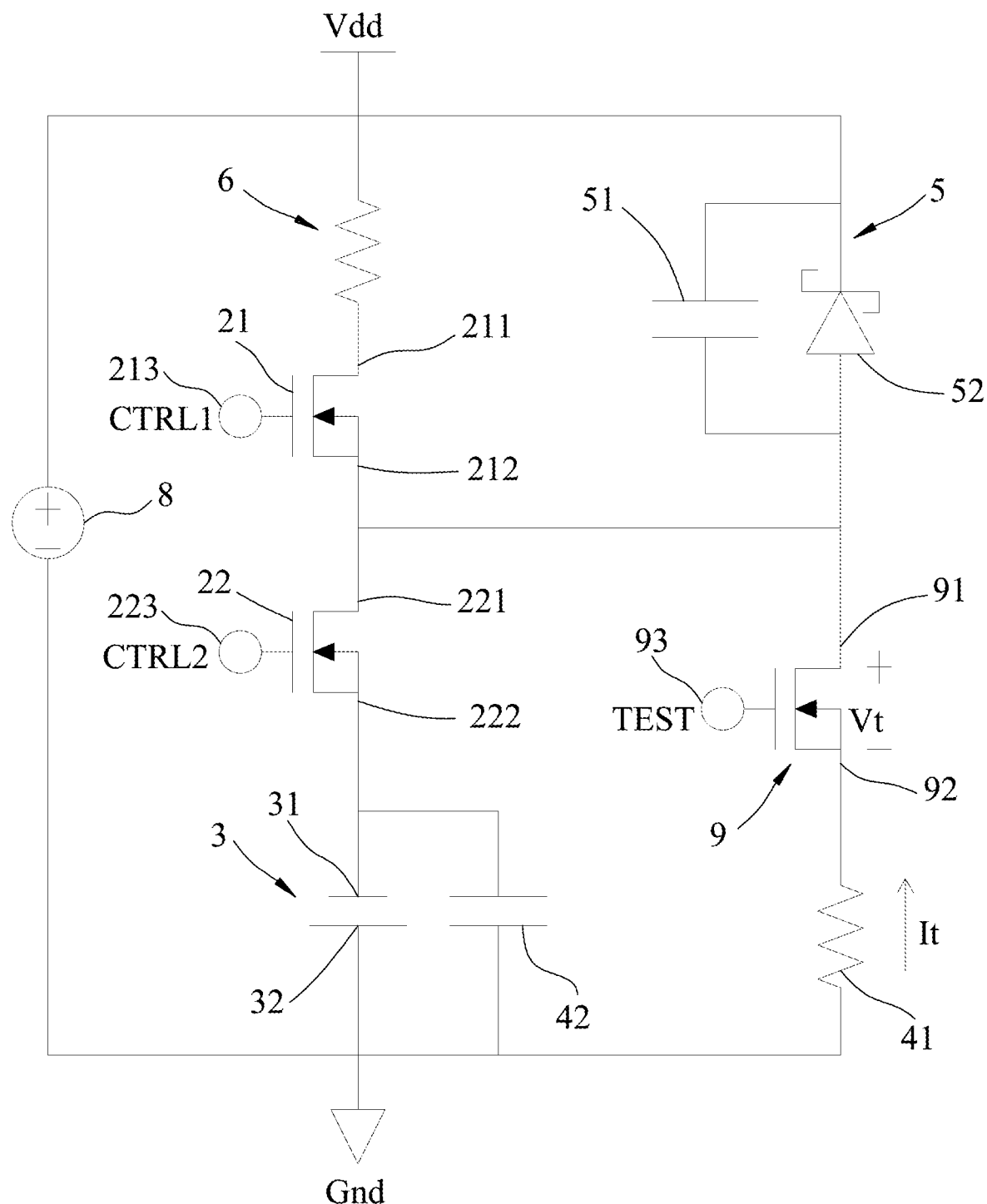
FIG. 5 is a circuit diagram illustrating the embodiment of the universal switching platform configured to test a transistor that is reverse conducting.
Figure 6:
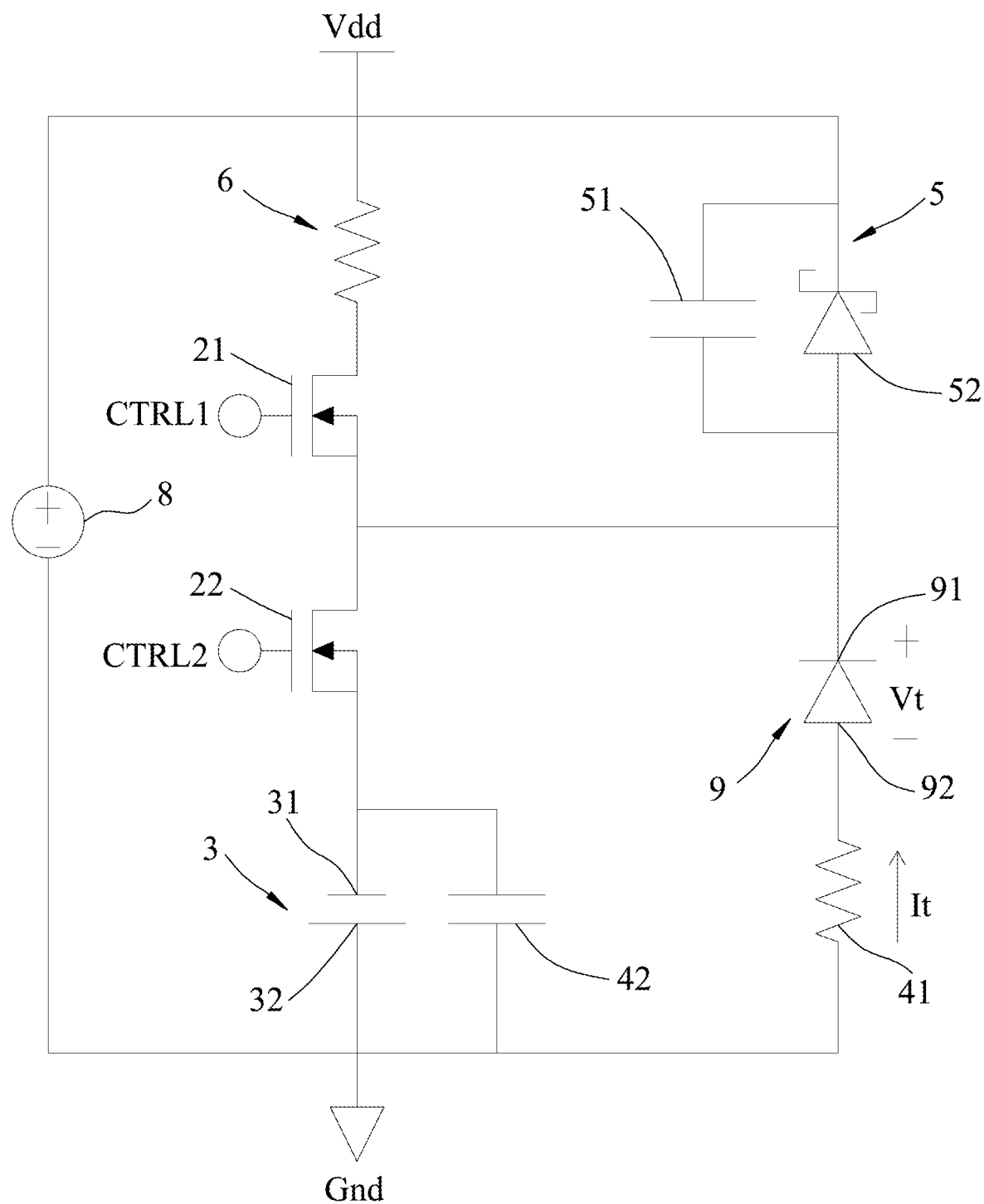
FIG. 6 is a circuit diagram illustrating the embodiment of the universal switching platform configured to test a rectifier diode that is forward conducting.

Referring to FIGS. 4 to 6, an embodiment of a universal switching platform according to the disclosure is configured to test a device under test 9 (also referred to as a sample). As shown in FIGS. 4 and 5, the device under test 9 may be a transistor. The transistor (e.g., an AlGaN/GaN high electron mobility transistor (HEMT) or an N-type metal oxide semiconductor field effect transistor (nMOSFET)) has a first terminal 91 (e.g., a drain terminal), a second terminal 92 (e.g., a source terminal), and a control terminal 93 (e.g., a gate terminal) that is connected to a control circuit (not shown) to receive a test signal (TEST) therefrom. The transistor transitions between conduction (i.e., being in an on state) and non-conduction (i.e., being in an off state) based on the test signal (TEST). Alternatively, as shown in FIG. 6, the device under test 9 may be a rectifier diode. The rectifier diode has a first terminal 91 (e.g., a cathode) and a second terminal 92 (e.g., an anode), and transitions between conduction (i.e., being in a forward state) and non-conduction (i.e., being in a reverse state) based on a voltage thereacross.

The embodiment of the universal switching platform includes a first power source 8, a first switch 21, a second switch 22 and a second power source 3. The first power source 8 has a positive terminal (Vdd), and a negative terminal (Gnd) that is configured to be coupled to the second terminal 92 of the device under test 9. The first switch 21, the second switch 22 and the second power source 3 are coupled in series between the positive and negative terminals (Vdd, Gnd) of the first power source 8, with the first switch 21 coupled to the positive terminal (Vdd) of the first power source 8 and the second power source 3 coupled to the negative terminal (Gnd) of the first power source 8. A common node of the first and second switches 21, 22 is configured to be coupled to the first terminal 91 of the device under test 9. Optionally, the embodiment of the universal switching platform further includes a measurement resistor 41, a measurement capacitor 42, a capacitive device 5 and a load resistor 6.

The first switch 21 (e.g., an nMOSFET) has a first terminal 211 (e.g., a drain terminal) that is coupled to the positive terminal (Vdd) of the first power source 8 through the load resistor 6, a second terminal 212 (e.g., a source terminal) that is configured to be coupled to the first terminal 91 of the device under test 9, and a control terminal 213 (e.g., agate terminal) that is configured to be coupled to the control circuit to receive a first control signal (CTRL1) therefrom. The first switch 21 transitions between conduction and non-conduction based on the first control signal (CTRL1).

The second switch 22 (e.g., an nMOSFET) has a first terminal 221 (e.g., a drain terminal) that is coupled to the second terminal 212 of the first switch 21, a second terminal 222 (e.g., a source terminal), and a control terminal 223 (e.g., a gate terminal) that is configured to be coupled to the control circuit to receive a second control signal (CTRL2) therefrom. The second switch 22 transitions between conduction and non-conduction based on the second control signal (CTRL2).

The embodiment of the universal switching platform provides a voltage and a current to test the device under test 9 when the first and second switches 21, 22 are controlled by the control circuit to transition between conduction and non-conduction. Optionally, when the device under test 9 is made of a third generation semiconductor material (e.g., gallium nitride (GaN)), each of the first and second switches 21, 22 is made of silicon carbide (SiC), so its applied voltage and transition speed can be consistent with those of the device under test 9 (e.g., 800V and 500 kHz).

The second power source 3 has a first terminal 31 that is connected to the second terminal 222 of the second switch 22, and a second terminal 32 that is coupled to the negative terminal (Gnd) of the first power source 8. The second power source 3 provides a voltage that is smaller than a voltage provided by the first power source 8 in magnitude. Optionally, a magnitude of the voltage provided by the second power source 3 is adjustable, the second power source 3 is configured to be further coupled to the control circuit, and the magnitude of the voltage provided by the second power source 3 can be adjusted by the control circuit. As shown in FIG. 4, the first and second terminals 31, 32 of the second power source 3 are respectively a positive terminal and a negative terminal when the embodiment of the universal switching platform is configured to test the device under test 9 that is the transistor and that is forward conducting. Alternatively, as shown in FIGS. 5 and 6, the first and second terminals 31, 32 of the second power source 3 are respectively the negative terminal and the positive terminal when the embodiment of the universal switching platform is configured to test the device under test 9 that is the transistor and that is reverse conducting, or when the embodiment of the universal switching platform is configured to test the device under test 9 that is the rectifier diode and that is forward conducting. Each of the first and second power sources 8, 3 may be a power supply. Because of the inclusion of the second power source 3 in the embodiment of the universal switching platform, a conduction current of the device under test 9 can be measured.

The measurement capacitor 42 is coupled to the second power source 3 in parallel, and cooperates with the second power source 3 to form an ideal power source that can provide a fast changing current.

The measurement resistor 41 is configured to be coupled between the second terminal 92 of the device under test 9 and the negative terminal (Gnd) of the first power source 8, and serves as a detector to detect a test current (It) flowing through the device under test 9. An oscilloscope (not shown) can be used to measure and display a voltage across the measurement resistor 41 that is positively proportional to the test current (It) in magnitude.

The capacitive device 5 is coupled between the positive terminal (Vdd) of the first power source 8 and the second terminal 212 of the first switch 21, and includes a load capacitor 51 and a load diode 52 that are coupled in parallel. A capacitance of the capacitive device 5 is related to a peak magnitude of the test current (It). The peak magnitude of the test current (It) can be adjusted by changing the capacitance of the capacitive device 5. Alternatively, the capacitive device 5 may include either the load capacitor 51 or the load diode 52. Optionally, the load diode 52 is a Schottky diode that has a fast transition speed and a low conduction voltage.

The load resistor 6 is coupled between the positive terminal (Vdd) of the first power source 8 and the first terminal 211 of the first switch 21, and its resistance is related to a turn-off speed of the device under test 9. The lower the resistance of the load resistor 6, the higher the turn-off speed of the device under test 9.

Figure 7:
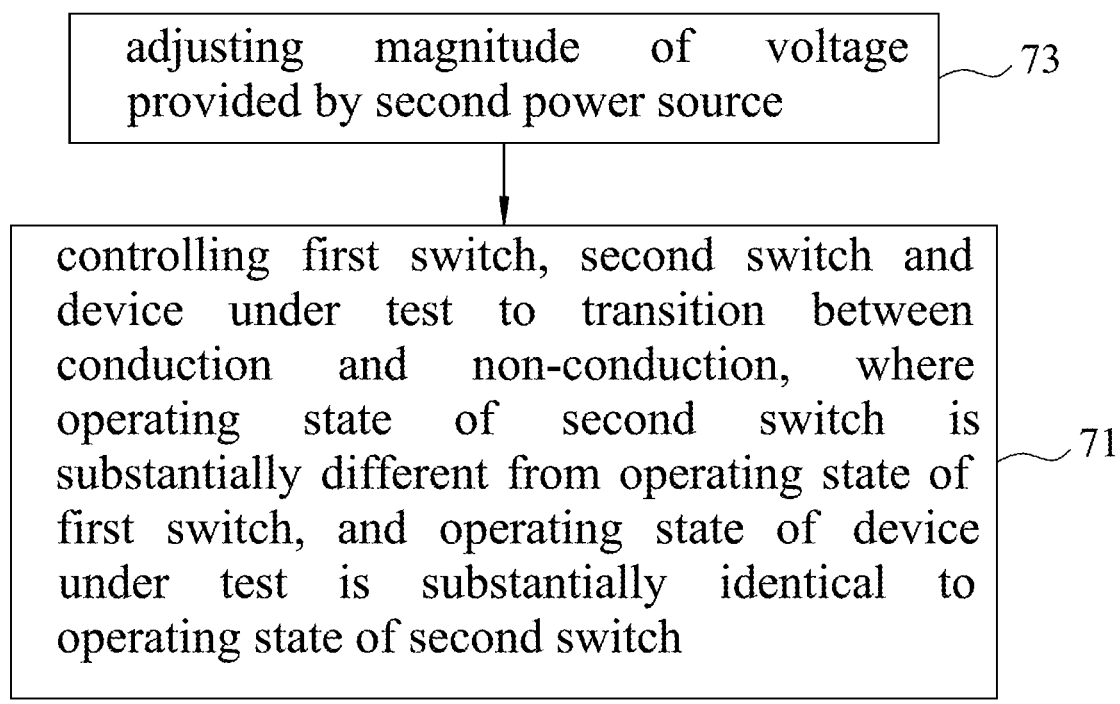
FIG. 7 is a flow chart illustrating an embodiment of a universal switching method according to the disclosure for controlling the embodiment of the universal switching platform and controlling the transistor or the rectifier diode to be tested by the embodiment of the universal switching platform.

Referring to FIGS. 4 and 7, an embodiment of a universal switching method according to the disclosure is to be performed by the control circuit, and is for controlling the embodiment of the universal switching platform and the device under test 9 coupled thereto. The embodiment of the universal switching method includes a step 71.

In step 71, the control circuit controls the first switch 21, the second switch 22 and the device under test 9 to transition between conduction and non-conduction, where an operating state (either conduction or non-conduction) of the second switch 22 is substantially different from an operating state (either conduction or non-conduction) of the first switch 21, and an operating state (either conduction or non-conduction) of the device under test 9 is substantially identical to the operating state of the second switch 22.

Optionally, the embodiment of the universal switching method further includes a step 73.

In step 73, the control circuit adjusts the magnitude of the voltage provided by the second power source 3.

In application, steps 73, 71 can be executed repeatedly, such that the magnitude of the voltage provided by the second power source 3 increases stepwise to cause a magnitude of the conduction current of the device under test 9 to increase stepwise.

Various implementations of the embodiment of the universal switching method for providing different test environments are described below.

Figure 8:
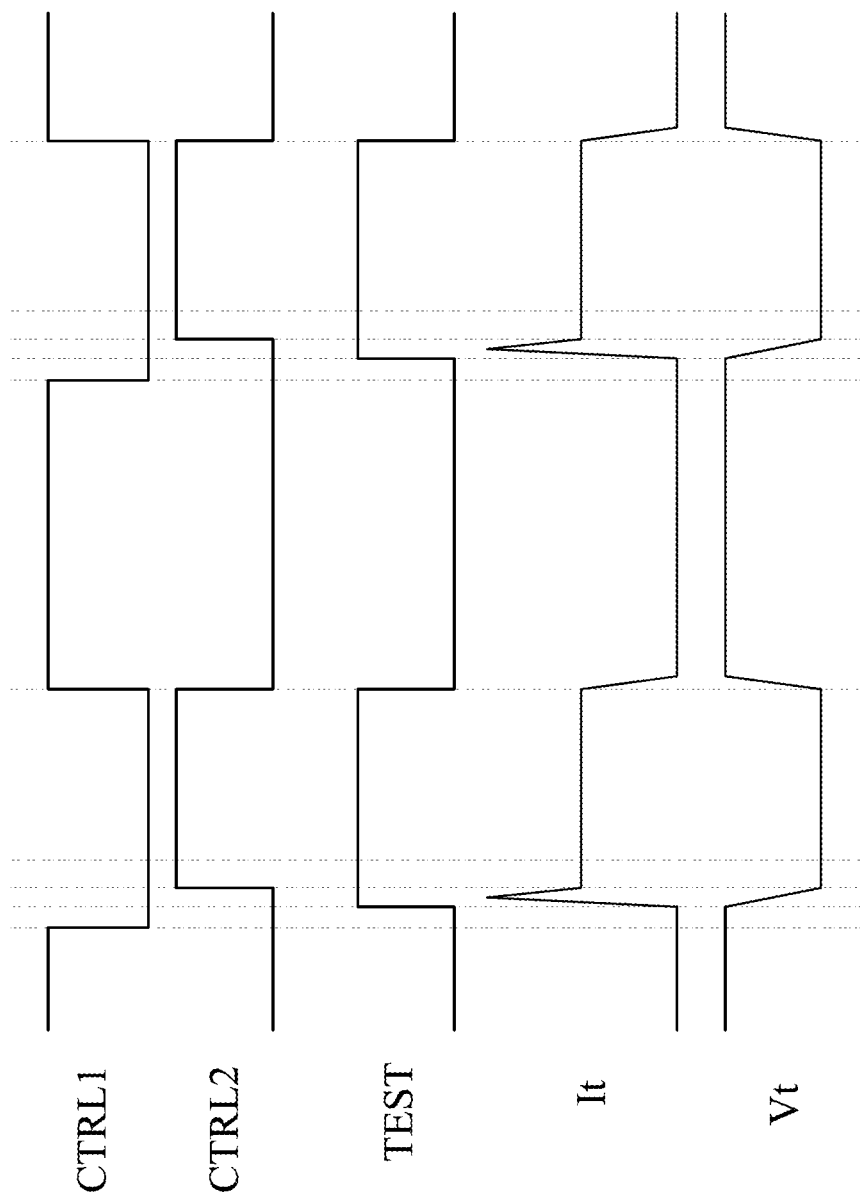
FIGS. 8 to 11 are timing diagrams illustrating various implementations of the universal switching method, respectively.

Referring to FIGS. 4, 7 and 8, a first implementation of the embodiment of the universal switching method is for controlling the embodiment of the universal switching platform (in which the first and second terminals 31, 32 of the second power source 3 are respectively the positive and negative terminals) and the device under test 9 (which is the transistor) as shown in FIG. 4 to cause hard switching and forward conduction of the transistor.

The oscilloscope is used to measure and display a test voltage (Vt) and the test current (It) of the device under test 9, which are respectively a drain-source voltage and a drain-source current of the transistor.

In step 71, the control circuit generates and provides the first control signal (CTRL1), the second control signal (CTRL2) and the test signal (TEST) respectively to the control terminal 213 of the first switch 21, the control terminal 223 of the second switch 22 and the control terminal 93 of the device under test 9. The first control signal (CTRL1), the second control signal (CTRL2) and the test signal (TEST) are generated in such a way that: (a) the second switch 22 transitions from non-conduction to conduction after the first switch 21 transitions from conduction to non-conduction, and transitions from conduction to non-conduction upon the first switch 21 transitioning from non-conduction to conduction; and (b) the device under test 9 transitions from non-conduction to conduction after the first switch 21 transitions from conduction to non-conduction and before the second switch 22 transitions from non-conduction to conduction, and transitions from conduction to non-conduction upon the first switch 21 transitioning from non-conduction to conduction.

As a consequence, for the device under test 9, parameters such as a dynamic on-resistance and a dynamic threshold voltage and performance during the off state, hard switching turn-on and turn-off transient can be obtained.

Figure 9:
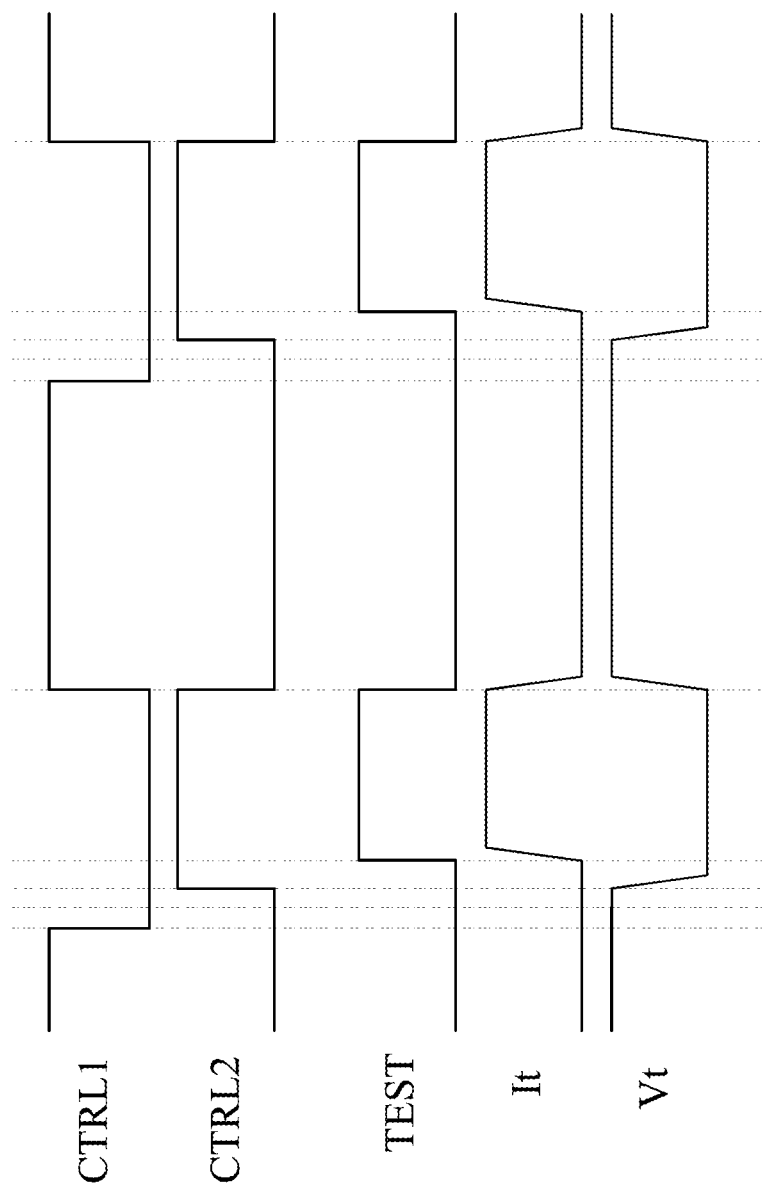

Referring to FIGS. 4, 7 and 9, a second implementation of the embodiment of the universal switching method is for controlling the embodiment of the universal switching platform (in which the first and second terminals 31, 32 of the second power source 3 are respectively the positive and negative terminals) and the device under test 9 (which is the transistor) as shown in FIG. 4 to cause soft switching and forward conduction of the transistor.

The oscilloscope is used to measure and display the test voltage (Vt) and the test current (It) of the device under test 9, which are respectively the drain-source voltage and the drain-source current of the transistor.

In step 71, the control circuit generates and provides the first control signal (CTRL1), the second control signal (CTRL2) and the test signal (TEST) respectively to the control terminal 213 of the first switch 21, the control terminal 223 of the second switch 22 and the control terminal 93 of the device under test 9. The first control signal (CTRL1), the second control signal (CTRL2) and the test signal (TEST) are generated in such a way that: (a) the second switch 22 transitions from non-conduction to conduction after the first switch 21 transitions from conduction to non-conduction, and transitions from conduction to non-conduction upon the first switch 21 transitioning from non-conduction to conduction; and (b) the device under test 9 transitions from non-conduction to conduction after the second switch 22 transitions from non-conduction to conduction, and transitions from, conduction to non-conduction upon the first switch 21 transitioning from non-conduction to conduction.

As a consequence, for the device under test 9, the parameters such as the dynamic on-resistance and the dynamic threshold voltage and the performance during the off state, zero voltage switching (ZVS) turn-on and the turn-off transient can be obtained.

Figure 10:
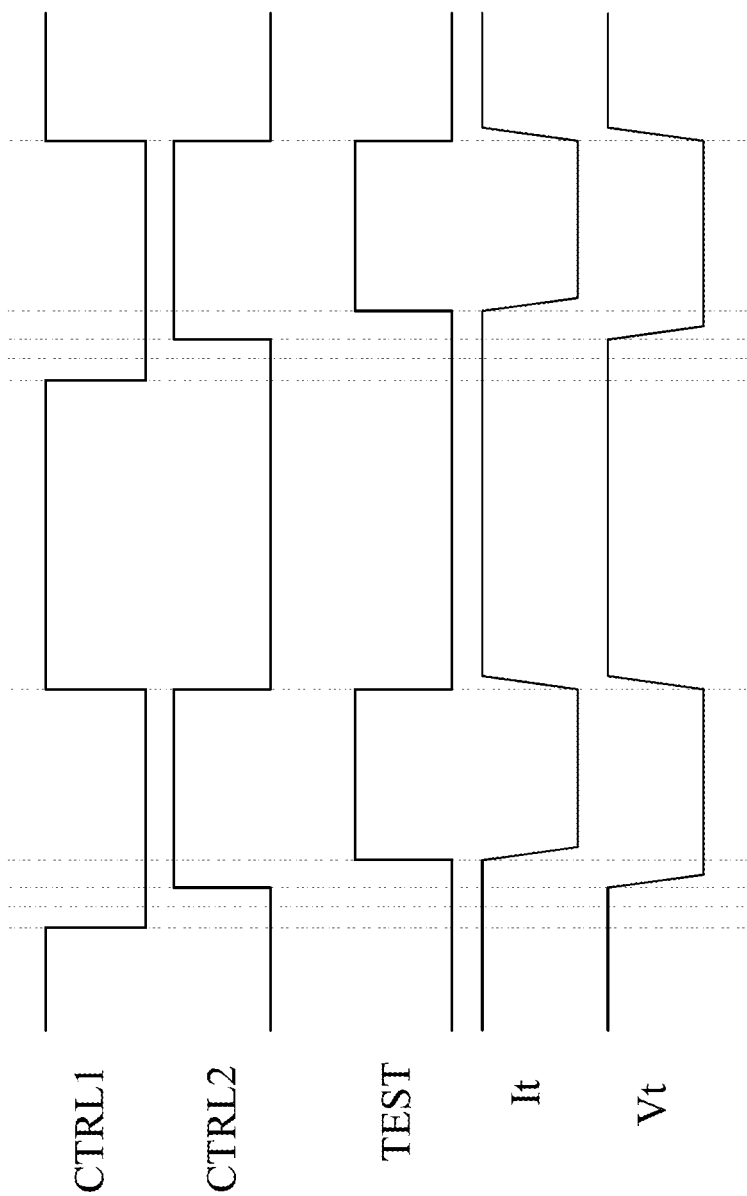

Referring to FIGS. 5, 7 and 10, a third implementation of the embodiment of the universal switching method is for controlling the embodiment of the universal switching platform (in which the first and second terminals 31, 32 of the second power source 3 are respectively the negative and positive terminals) and the device under test 9 (which is the transistor) as shown in FIG. 5 to cause soft switching and reverse conduction of the transistor.

The oscilloscope is used to measure and display the test voltage (Vt) and the test current (It) of the device under test 9, which are respectively the drain-source voltage and a source-drain current of the transistor.

In step 71, the control circuit generates and provides the first control signal (CTRL1), the second control signal (CTRL2) and the test signal (TEST) respectively to the control terminal 213 of the first switch 21, the control terminal 223 of the second switch 22 and the control terminal 93 of the device under test 9. The first control signal (CTRL1), the second control signal (CTRL2) and the test signal (TEST) are generated in such a way that: (a) the second switch 22 transitions from non-conduction to conduction after the first switch 21 transitions from conduction to non-conduction, and transitions from conduction to non-conduction upon the first switch 21 transitioning from non-conduction to conduction; and (b) the device under test 9 transitions from non-conduction to conduction after the second switch 22 transitions from non-conduction to conduction, and transitions from conduction to non-conduction upon the first switch 21 transitioning from non-conduction to conduction.

As a consequence, for the device under test 9, the parameters such as the dynamic on-resistance, the dynamic threshold voltage and a dynamic conduction voltage and the performance during the off state and the ZVS turn-on can be obtained.

Figure 11:
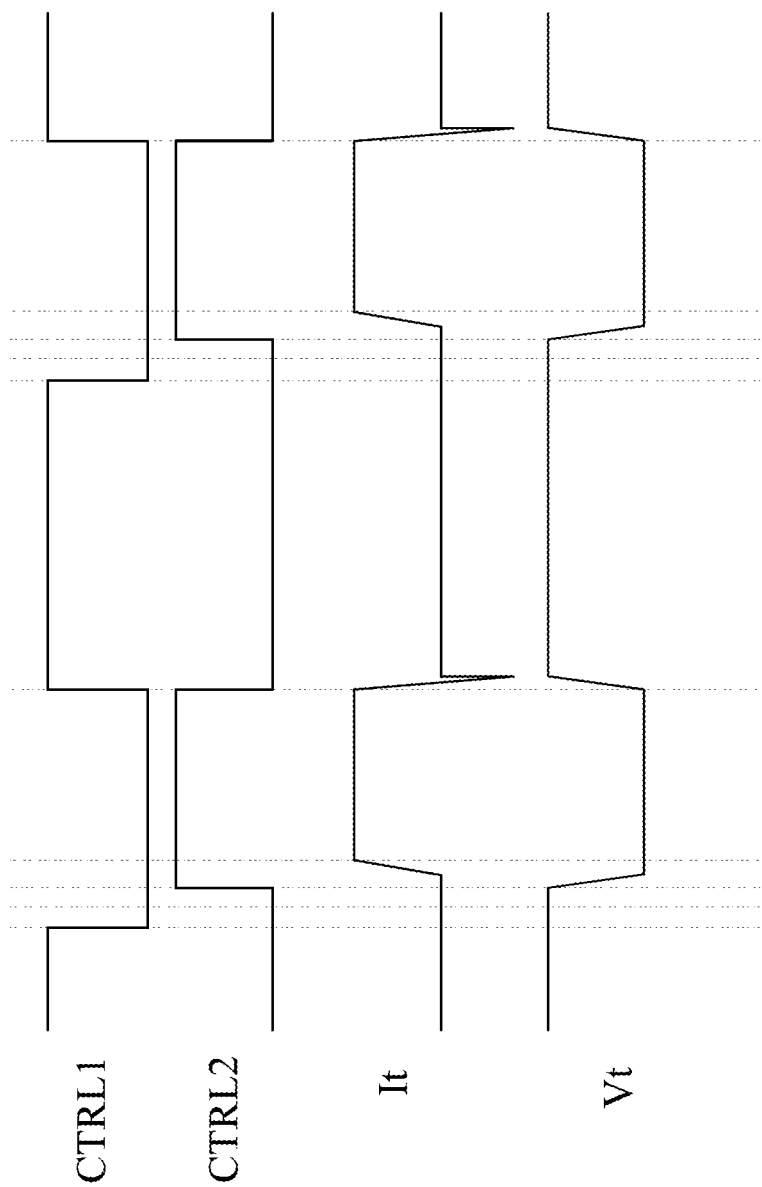

Referring to FIGS. 6, 7 and 11, a fourth implementation of the embodiment of the universal switching method is for controlling the embodiment of the universal switching platform (in which the first and second terminals 31, 32 of the second power source 3 are respectively the negative and positive terminals) and the device under test 9 (which is the rectifier diode) as shown in FIG. 6 to cause soft switching and forward conduction of the rectifier diode.

In step 71, the control circuit generates and provides the first control signal (CTRL1) and the second control signal (CTRL2) respectively to the control terminal 213 of the first switch 21 and the control terminal 223 of the second switch 22. The first control signal (CTRL1) and the second control signal (CTRL2) are generated in such a way that: the second switch 22 transitions from, non-conduction to conduction after the first switch 21 transitions from conduction to non-conduction, and transitions from conduction to non-conduction upon the first switch 21 transitioning from non-conduction to conduction. The device under test 9 automatically transitions synchronously with the second switch 22.

As a consequence, for the device under test 9, parameters such as a dynamic forward voltage, a dynamic reverse recovery time and a dynamic reverse recovery charge and the performance during the reverse state and a forward transient can be obtained.

In view of the above, by virtue of the embodiment of the universal switching platform and the embodiment of the universal switching method, the voltage and the current can be provided to test the device under test 9. In addition, when the device under test 9 conducts, the test current (It) is supplied by the second power source 3, the voltage provided by which is lower in magnitude than the voltage provided by the first power source 8. Therefore, the embodiment of the universal switching platform has relatively low power consumption, and a total number of the devices under test 9 that can be tested simultaneously and respectively by multiple universal switching platforms can be relatively large. Moreover, the embodiment of the universal switching platform does not include an inductor load, so each of a transition frequency and a duty cycle of the device under test 9 becomes a parameter that can be independently adjusted within a relatively large range. As a consequence, the embodiment of the universal switching platform and the embodiment of the universal switching method can cooperatively provide the following capabilities: system like stress condition for high temperature operating life (HTOL); flexibility of acceleration test (i.e., an ambient temperature, the magnitude of the voltage provided by the first power source 8, the magnitude of the conduction current of the device under test 9, the peak magnitude of the test current (It), and the transition frequency and the duty cycle of the device under test 9 can be adjusted); low power consumption; a large total number of the samples that can be tested simultaneously; and easy to setup and control.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A universal switching platform configured to test a device under test, the device under test having a first terminal and a second terminal, said universal switching platform comprising:
   a first power source having a positive terminal, and a negative terminal that is configured to be coupled to the second terminal of the device under test;
   a first switch;
   a second switch; and
   a second power source;
   said first switch, said second switch and said second power source being coupled in series between said positive and negative terminals of said first power source, with said first switch coupled to said positive terminal of said first power source and said second power source coupled to said negative terminal of said first power source;
   a common node of said first and second switches being configured to be coupled to the first terminal of the device under test;
   said universal switching platform providing a voltage and a current to test the device under test when said first and second switches are controlled to transition between conduction and non-conduction.

2. The universal switching platform of claim 1, wherein said second power source provides a voltage with an adjustable magnitude.

3. The universal switching platform of claim 1, further comprising a capacitive device that is coupled between said positive terminal of said first power source and said common node of said first and second switches.

4. The universal switching platform of claim 3, further comprising a load resistor that is coupled between said positive terminal of said first power source and said first switch.

5. The universal switching platform of claim 3, wherein said capacitive device includes one of a capacitor, a diode, and a parallel combination of said capacitor and said diode.

6. The universal switching platform of claim 1, further comprising:
   a measurement capacitor coupled to said second power source in parallel; and
   a measurement resistor configured to be coupled between the second terminal of the device under test and said negative terminal of said first power source.

7. A universal switching method for controlling the universal switching platform, of claim 1 and the device under test coupled thereto, said universal switching method comprising a step of:
- (A) controlling the first switch, the second switch and the device under test to transition between conduction and non-conduction, where an operating state of the second switch is substantially different from an operating state of the first switch, and an operating state of the device under test is substantially identical to the operating state of the second switch.

8. The universal switching method of claim 7, the second power source providing a voltage with an adjustable magnitude, said universal switching method further comprising a step of:
- (B) adjusting the magnitude of the voltage provided by the second power source.

9. The universal switching method of claim 7, the second power source having a positive terminal that is coupled to the second switch, and a negative terminal that is coupled to the negative terminal of the first power source, wherein step (A) includes:
  providing a first control signal, a second control signal and a test signal respectively to the first switch, the second switch and the device under test, such that
  the second switch transitions from non-conduction to conduction after the first switch transitions from conduction to non-conduction, and transitions from conduction to non-conduction upon the first switch transitioning from non-conduction to conduction, and
  the device under test transitions from non-conduction to conduction after the first switch transitions from conduction to non-conduction and before the second switch transitions from non-conduction to conduction, and transitions from conduction to non-conduction upon the first switch transitioning from non-conduction to conduction.

10. The universal switching method of claim 7, wherein step (A) includes:
  providing a first control signal, a second control signal and a test signal respectively to the first switch, the second switch and the device under test, such that
  the second switch transitions from non-conduction to conduction after the first switch transitions from conduction to non-conduction, and transitions from conduction to non-conduction upon the first switch transitioning from non-conduction to conduction, and
  the device under test transitions from non-conduction to conduction after the second switch transitions from non-conduction to conduction, and transitions from conduction to non-conduction upon the first switch transitioning from non-conduction to conduction.

11. The universal switching method of claim 7, the second power source having a negative terminal that is coupled to the second switch, and a positive terminal that is coupled to the negative terminal of the first power source, wherein step (A) includes:
  providing a first control signal and a second control signal respectively to the first switch and the second switch, such that
  the second switch transitions from non-conduction to conduction after the first switch transitions from conduction to non-conduction, and transitions from conduction to non-conduction upon the first switch transitioning from non-conduction to conduction; and
  the device under test automatically transitions synchronously with the second switch.

* * * * *